United States Patent

Worzischek

[11] Patent Number: 6,073,751
[45] Date of Patent: Jun. 13, 2000

[54] AUTOMATIC EQUIPPING UNIT FOR ELECTRICAL ASSEMBLIES WITH A BELT STORE UNIT FOR DISCHARGED COMPONENTS

[75] Inventor: Alexander Worzischek, Neuried, Germany

[73] Assignee: Siemens Aktiengesellschaft, Munich, Germany

[21] Appl. No.: 09/114,368

[22] Filed: Jul. 14, 1998

[30] Foreign Application Priority Data

Mar. 30, 1998 [DE] Germany ............... 198 14 160

[51] Int. Cl.<sup>7</sup> ............................. B65G 47/26
[52] U.S. Cl. ............... 198/460.1; 198/460.3; 198/341.01; 198/464.3
[58] Field of Search ............. 198/341.01, 341.04, 198/341.05, 460.1, 460.3, 464.2, 464.3, 502.2

[56] References Cited

U.S. PATENT DOCUMENTS

| 5,484,049 | 1/1996 | Huang et al. | 198/460.3 |
| 5,738,202 | 4/1998 | Ydoate et al. | 198/460.1 |
| 5,860,504 | 1/1999 | Lazzarotti | 198/502.2 |

*Primary Examiner*—Jospeh E. Valenza
*Attorney, Agent, or Firm*—Hill & Simpson

[57] ABSTRACT

An automatic equipping unit for electrical assemblies with a belt store unit for discharged components wherein the components discharged by the automatic equipping unit are placed onto the belt store unit in a defined position. A belt drive that can be controlled in fine steps accepts the corresponding length values of the component from a central controller of the automatic equipping unit and conveys this component out of a deposit area of the belt store unit. As a result thereof, the control outlay is reduced and the deposit capacity is increased.

2 Claims, 1 Drawing Sheet

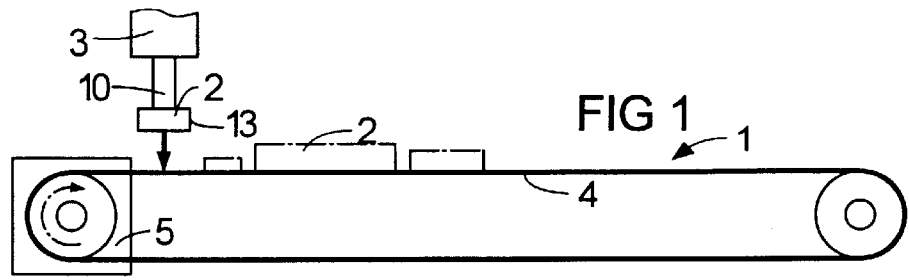
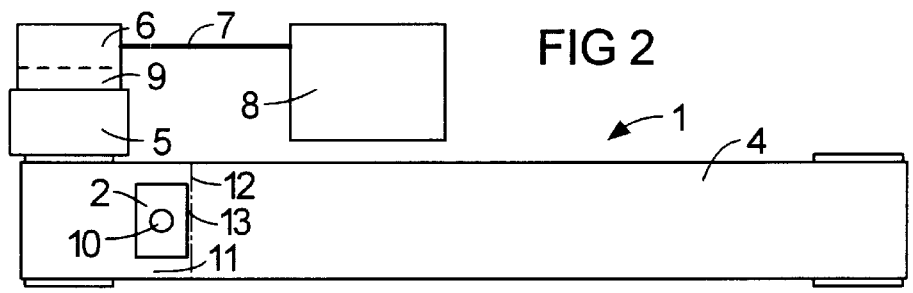
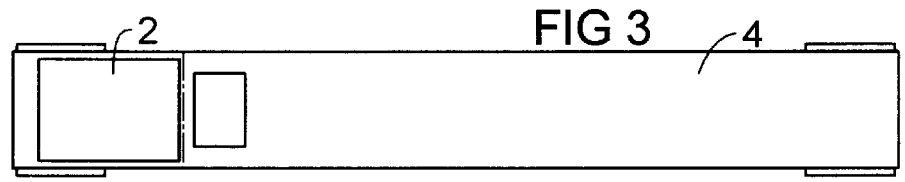
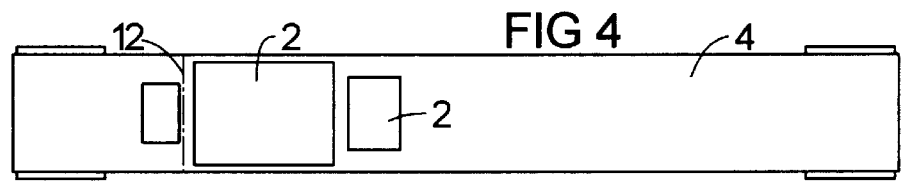
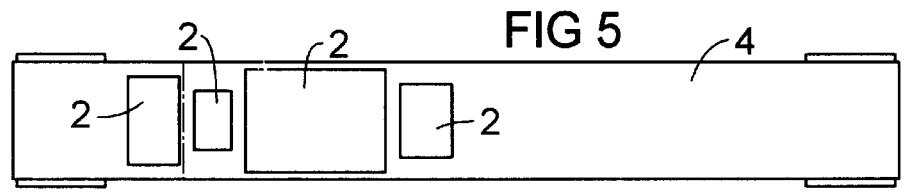

AUTOMATIC EQUIPPING UNIT FOR ELECTRICAL ASSEMBLIES WITH A BELT STORE UNIT FOR DISCHARGED COMPONENTS

BACKGROUND OF THE INVENTION

1. Field of the Invention

The present invention is directed to an automatic equipping unit for equipping electrical assemblies including a belt store unit for the acceptance of discharged components that can be placed onto a deposit area at the start of a circulating conveyor belt of the belt store unit with a movable equipping head of the automatic equipping unit.

1. Description of the Prior Art

Such a conveyor belt makes it possible to specifically remove larger and, in particular, more expensive component parts such as integrated circuits for the purpose of error diagnosis. It is customary to attach a light barrier immediately following the deposit area. After the component has been put in place on the deposit area, the conveyor belt is activated until the component has passed through the light barrier. A metal part is placed onto the belt preceding the first component wherein the position of the metal part is acquired by inductive proximity switches for monitoring the filling level in order not to exceed the maximum deposit capacity of the belt.

SUMMARY OF THE INVENTION

The present invention, is based on the object of simplifying the belt store unit and increasing its capacity. By using a step counter, it is possible to specifically drive the conveyor belt by the component length extending in the conveying direction plus the length of a required gap without requiring the use of an expensive light barrier. As a result of the defined placement of the components on the deposit area, the components can be closely spaced from one another so that the acceptance capacity of the conveyor belt is increased. The step counter also makes it possible to register the entire feed length of the conveyor belt without a metallic part and without the associated and requisite proximity switches.

According to an embodiment of the present invention, the cumulative feed length of the conveyor belt can be stored in the central controller of the automatic equipping unit so that the respective filling level can be incorporated into the machine control.

Additional features and advantages of the present invention are described in, and will be apparent from, the Detailed Description of the Preferred Embodiments and the Drawings.

DESCRIPTION OF THE DRAWINGS

FIG. 1 shows a side view of a belt store unit for electrical components discharged by an automatic equipping unit.

FIG. 2 shows a plan view onto the belt store unit of FIG. 1 with a central controller of the automatic equipping unit.

FIGS. 3–5 show various filling levels of the belt store unit with an increasing plurality of components.

DETAILED DESCRIPTION OF THE PREFERRED EMBODIMENTS

FIGS. 1 and 2 show a belt store unit 1 that, for example, is secured to a work table of an automatic equipping unit for electrical assemblies. Such a belt store unit 1 serves the purpose of accepting discharged components 2 that are placed onto the belt store unit 1 by an equipping head 3 of the automatic equipping unit wherein components 2 shown dot-dashed indicate the occupation of the belt store unit 1 according to FIG. 5.

The belt store unit 1 includes a circulating conveyor belt 4, a belt drive 5 and a monitor 6 that is connected via a data line 7 to a central controller 8 of the automatic equipping unit. The belt drive 5, fashioned as a drive motor, makes it possible to drive the conveyor belt 4 in the direction of the dot-dash circular arrow. The monitor 6 includes a step counter 9 that makes it possible to control the feed length of the conveyor belt 4 in fine steps.

The equipping head 3 includes a suction pipette 10 at whose tip one of the components 2 discharged from the automatic equipping unit is sucked up. By lowering the suction pipette 10 according to the vertical arrow, the component 2 can be placed in a deposit area 11 at the start of the conveyor belt 4 with the belt drive switched off. The end of the deposit area 11 placed in conveying direction is indicated by a virtual transverse line 12.

The central controller 8 knows the outside dimensions and the exact position of the respective component 2 and controls the equipping head 3 such that the front side 13 of the component 2 pointing in the conveying direction is aligned at the transverse line 12 and assumes what is always a constant, defined position regardless of the different outside dimensions. Subsequently, the suction pipette 10 is raised in order to pick up a new component part.

Via the data line 7, the central controller 8 informs the monitor 6 of the length dimension of the component 2 oriented in the conveying direction. In response thereto, the monitor 6 controls the belt drive 5 such that the conveyor belt 4 is advanced by this length dimension plus a safety margin. The component 2 is thereby moved out of the deposit area 11 to such an extent that a new component can be set down in a tight spacing. The step counter 9 monitors the respective feed length and communicates the entire, cumulative feed length of the conveyor belt 4 to the central controller 8 via the data line 7.

FIGS. 3 through 5, which omit various drive and control functions/devices, show various phases of the occupation of the conveyor belt 4 with the components 2. According to FIG. 3, the first of the components 2 has already been conveyed out of the deposit area 11 according to the horizontal arrow that a further component 2 can be set down at a close interval behind it, this likewise being aligned at the transverse line 12. Subsequently, the conveyor belt 4 is advanced by the greater length until this component 2 assumes the position outside the deposit area 11 shown in FIG. 4, whereupon a new component part 2 can again be set down.

In this way, the conveyor belt 4 can be successively occupied until the first of the components 2 reaches the end of the belt. Since the central controller 8 (FIG. 2) monitors the cumulative feed length of the conveyor belt 4, this condition can be signalled to the operating personal in order to empty the conveyor belt 4 and initiate a new occupation cycle.

Although the present invention has been described with reference to specific embodiments, those of skill in the art will recognize that changes may be made thereto without departing from the spirit and scope of the invention as set forth in the hereafter appended claims.

I claim as my invention:

1. An automatic equipping unit for equipping electric supplies, comprising:

a belt store unit having both a belt drive and a circulating conveyor belt wherein the conveyor belt is driven by the belt drive and includes a component deposit area;

a movable equipping head for placing components on the component deposit area when the conveyor belt is stationary wherein a front side of each component points in a conveying direction;

a monitor having a step counter, the monitor coupled to the belt drive for controlling feed length of the conveyor belt wherein the monitor activates the belt drive upon placement of a component on the component deposit area and advances the conveyor belt a distance associated with a length of the component; and a central controller connected to both the monitor and the movable equipping head, the central controller containing the length dimension data of the components and transferring the length dimension data to the monitor.

2. An automatic equipping unit as claimed in claim 1, wherein cumulative feed length data of the conveyor belt is stored in the central controller.

* * * * *